(12) United States Patent
Anwar et al.

(10) Patent No.: US 8,164,298 B2
(45) Date of Patent: Apr. 24, 2012

(54) SYSTEM AND METHOD FOR DETECTING LOSS OF ISOLATION WHILE AN AC MOTOR IS OPERATING

(75) Inventors: Mohammad N. Anwar, Van Buren Township, MI (US); Bryan M. Ludwig, West Bloomfield, MI (US); S.M. N. Hasan, Troy, MI (US); Sean E. Gleason, West Bloomfield, MI (US); Bon Ho Bae, Torrance, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 423 days.

(21) Appl. No.: 12/412,053

(22) Filed: Mar. 26, 2009

(65) Prior Publication Data

US 2010/0244760 A1 Sep. 30, 2010

(51) Int. Cl.
*H02P 3/18* (2006.01)
(52) U.S. Cl. ........ 318/812; 318/430; 318/432; 318/490; 361/23
(58) Field of Classification Search .................. 318/430, 318/490, 432, 812; 361/23; 324/503, 510, 324/765.01
See application file for complete search history.

(56) References Cited

U.S. PATENT DOCUMENTS

| | | | | |
|---|---|---|---|---|
| 6,381,110 B1 * | 4/2002 | Nagashima et al. | ............. | 361/23 |
| 7,777,516 B2 * | 8/2010 | Zhou et al. | ............... | 324/765.01 |
| 7,847,580 B2 * | 12/2010 | Zhou et al. | ............... | 324/765.01 |
| 2008/0309366 A1 * | 12/2008 | Zhou et al. | .................... | 324/772 |
| 2009/0146599 A1 * | 6/2009 | Zhou et al. | .................... | 318/490 |

* cited by examiner

*Primary Examiner* — Paul Ip
(74) *Attorney, Agent, or Firm* — Ingrassia Fisher & Lorenz, P.C.

(57) ABSTRACT

Methods and systems are provided for detecting loss of isolation of a motor, connections, or phase cables while an AC motor is operating. The system includes a power supply that is substantially isolated from the ground or chassis having a power supply voltage, and a power inverter electrically coupled to the power supply. The power inverter is configured to provide AC current from the power supply in an AC phase at an AC terminal, with the phase having current at a fundamental frequency that controls the motor speed. An electric motor is electrically coupled to the AC terminal of the power inverter and has a chassis that is substantially electrically isolated from the AC terminal of the power inverter under normal operating conditions. A processor is configured to control the AC current provided by the power inverter. The processor is configured to receive a first voltage signal related to current flowing through a motor chassis. The first voltage signal includes a first component related to the fundamental frequency of the phases, and a second component related to the power supply voltage. The processor is further configured to filter the first voltage signal to attenuate the second component, to measure an amplitude of the first component, and to determine if an AC loss of isolation condition exists by comparing the amplitude of the first component to a fault value.

19 Claims, 5 Drawing Sheets

SYSTEM AND METHOD FOR DETECTING LOSS OF ISOLATION WHILE AN AC MOTOR IS OPERATING

TECHNICAL FIELD

The following disclosure generally relates to systems and methods for controlling electric motors, and more particularly relates to detecting loss of isolation in electrical motors AC cables and connections.

BACKGROUND

In many applications such as electric and hybrid electric vehicles, a DC power supply is used to supply power for a three phase electric motor. Three phase motors are typically driven by a three phase power inverter. While operating the motor, AC current flows in either a positive or a negative direction in each of the three phases, with current flowing in a positive direction in one phase being returned in a negative direction in one or both of the other phases. In normal operation the sum of currents in all three phases is ideally equal to zero, and the three phases are isolated from ground. In a fault state, however, such as where there is a short between one of the phases and a motor chassis (ground), some of the current is not returned through the phases, and therefore the sum of the currents in the three phases does not equal zero.

A typical method of detecting loss of isolation in the three phases uses three current sensors to measure the current in each of the three phases. Current sensors typically detect loss of isolation by measuring each of the three phases directly with a current sensor. The three measured currents are then summed, and if the sum is higher than a predetermined threshold value (ideally equal to zero) then a loss of isolation condition is detected. This method relies on the use of a separate current sensor for each of the three phases, and relies on the accuracy of the current sensors. It can also be difficult to detect a partial short with this method.

Accordingly, it is desirable to provide an improved system and method for detecting loss of isolation in a motor. Furthermore, other desirable features and characteristics will become apparent from the subsequent detailed description and the appended claims, taken in conjunction with the accompanying drawings and the foregoing technical field and background.

SUMMARY

A system is provided for operating a motor and detecting loss of isolation. The system comprises a power supply having a power supply voltage, and a power inverter electrically coupled to the power supply. The power inverter is configured to provide AC current from the power supply in three phases at three AC terminals, with the three phases having current at a fundamental frequency that controls the motor speed. A three phase electric motor is electrically coupled to the three AC terminals of the power inverter and has a chassis that is substantially electrically isolated from the three AC terminals of the power inverter under normal operating conditions. A processor is configured to control the AC current provided by the power inverter. The processor is configured to receive a first voltage signal (scaled DC power supply voltage) that may have components related to current flowing through a motor chassis. The first voltage signal includes a first component related to the fundamental frequency of the three phases, and a second component related to the power supply voltage. The processor is further configured to filter the first voltage signal to attenuate the second component, to measure an amplitude of the first component, and to determine if an AC loss of isolation condition exists by comparing the amplitude of the first component to a fault value.

A method is provided for detecting loss of isolation in a motor system. The motor system includes a power inverter having an input side and an output side, and a motor operating at a fundamental frequency. The motor has a motor chassis serving as a common reference to the input and output sides of the power inverter. The method comprises detecting a first voltage signal on the input side of the power inverter; and filtering the first voltage signal to extract a component of the first voltage signal related to the fundamental frequency that is transmitted to the input side via the common reference from the output side. The component of the first voltage signal includes a component amplitude. The method also comprises determining if an AC loss of isolation fault exists by comparing the component amplitude to an AC loss of isolation fault value.

DESCRIPTION OF THE DRAWINGS

A more complete understanding of the subject matter may be derived by referring to the detailed description and claims when considered in conjunction with the following figures, wherein like numerals denote like elements.

DESCRIPTION OF AN EXEMPLARY EMBODIMENT

Figure 1:
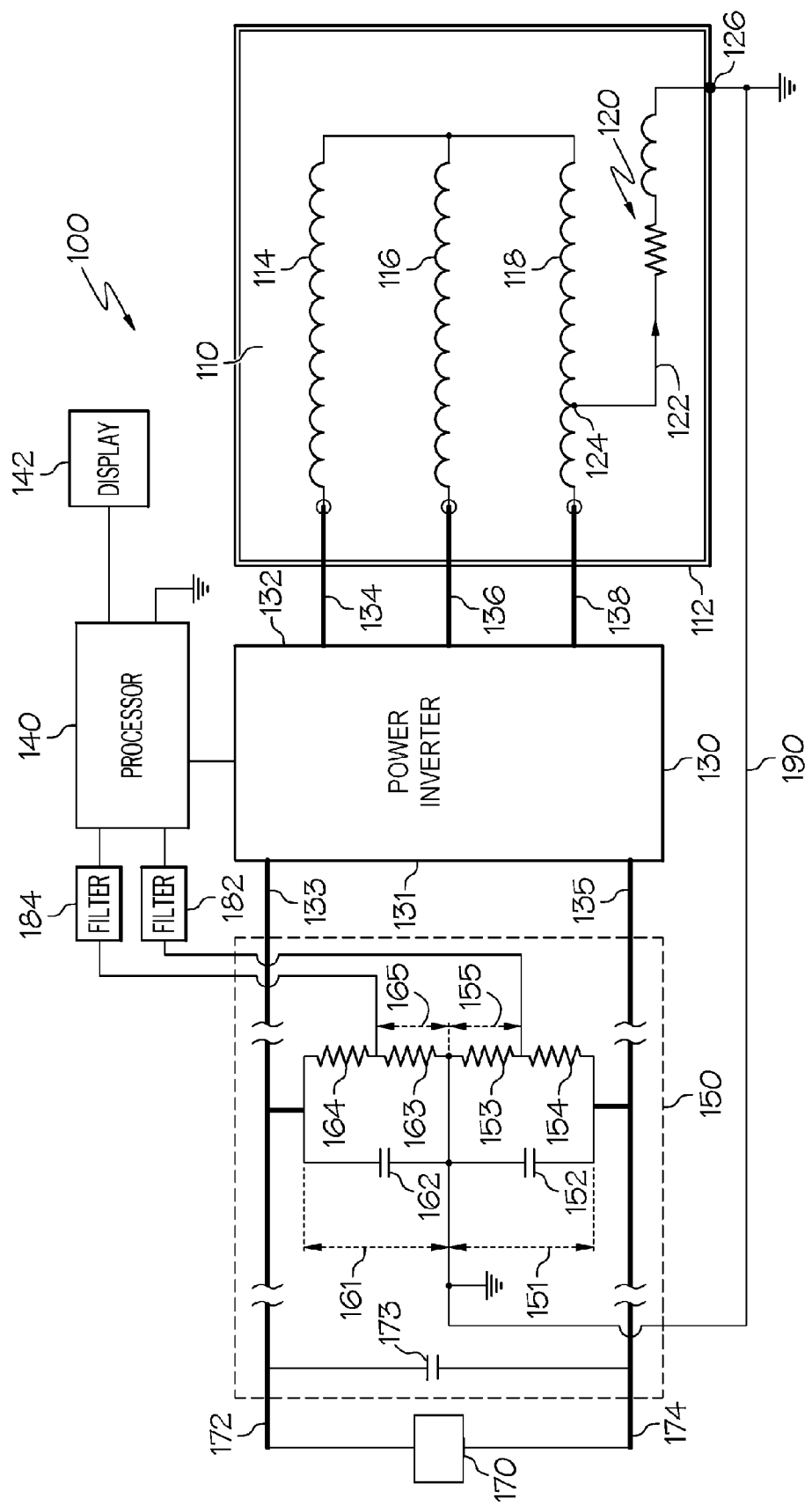
FIG. 1 shows a diagram of an exemplary three phase motor system.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

In an exemplary embodiment loss of isolation in a motor or the phase connections to the motor is detected on the input side of a power inverter, rather than on the output side as in conventional systems. The input side of the power inverter may be connected to the output side through a common ground connection, such as through the vehicle chassis or the like. The exemplary system detects whether the output signal from the output side of the power inverter is present on the input side of the power inverter. If the output signal is detected on the input side of the power inverter, then it can be deducted that current is flowing from one of the motor phases to the motor chassis that provides the ground, thereby, indicating a loss of isolation between ground and one or more phases in the motor or the three phase connections to the motor.

Only two current sensors instead of three current sensors can also be used on the output side of the power inverter to provide feedback for controlling the three phases. As conditions change in a motor, the impedance changes in each of the phases. For the purpose of control, a controller receives feedback from two or less of the phases of the motor.

Various advantages may be achieved using the exemplary embodiment. A three phase motor, for example, may be controlled with only two current sensors, as the current from two phases can be measured directly, and the current from the third phase can be calculated as the opposite of the sum of the two measured phases. As faults are no longer necessarily detected by the current sensors coupled to the phases of the motor, it may be possible in some embodiments to remove one of the current sensors. Additional advantages may be achieved in various embodiments.

The power inverter is connected to any suitable power supply, such as a DC power supply and supplies the AC phases for operating the motor. The DC power supply is substantially isolated from ground or chassis. Under normal operating conditions, a chassis of the motor is isolated from the AC phases, with no current flowing from the phases through the chassis. The motor chassis is also connected as a ground connection that connects to the input side of the power inverter. When loss of isolation between the chassis and one or more of the AC phases occurs, a relatively large current may flow through the motor chassis with the signal from the output side transmitted through the ground connection to the input side. In the exemplary embodiment the current flowing through the motor chassis and the vehicle chassis during a short to chassis (or ground) fault is measured on the input side of the power inverter to determine if loss of isolation has occurred in any of the AC phases. The exemplary method of determining loss of isolation also provides a determination when a partial loss of isolation has occurred in any one of the AC phases, as the output signal is still transmitted to the input side of the power inverter.

FIG. 1 shows an exemplary motor system 100 including a motor 110, a power inverter 130, a processor 140, a power bus 150, and a power source 170. Motor 110 is any multi-phase or single phase motor. In the exemplary embodiment motor 110 is a three phase motor and suitably includes a motor chassis 112, a first phase winding 114, a second phase winding 116, and a third phase winding 118. A phase to ground short 120 is shown by way of example, with short circuit current signal 122 flowing from a phase short location 124 in third phase winding 118 to chassis 112 at location 126. During normal operation, no short to chassis 120 is present and phase windings 114-118 are substantially isolated from motor chassis 112. AC loss of isolation may occur from a short in phase windings, as well as a short in phase connections, cables, and the like. For the purpose of simplicity, detection of phase shorts includes detection of shorts in connections and components that can result in loss of AC isolation.

In the exemplary embodiment a voltage related to short circuit current signal 122 is measured to determine loss of isolation. When a phase to ground fault occurs, short circuit current signal 122 may be transmitted through a ground connection 190 to power bus 150 on the input side 131 of power inverter 130. Short circuit current signal 122 may cause a first voltage 151 and 161 in power bus when loss of isolation occurs. In the exemplary embodiment loss of isolation for all three phases is determined by measuring first voltage 151 or 161 on the input side 131 of power inverter 130. Short circuit current signal 122 is shown in FIG. 1 as a short from third phase winding 118 to ground. Short circuit current signal 122, however, may be a short from any of the phase windings (114, 116, or 118), and transmitted to power bus 150 through ground connection 190. In this manner first voltage 151 measured in power bus 150 can indicate a short to ground in any of the phase windings (114, 116 and/or 118).

Power inverter 130 is any device capable of inverting a DC input power source into an output AC with one or more phases for driving a single-phase or multi-phase motor. Power inverter 130 may be used to drive motor 110. Power inverter 130 may be any type of power inverter, such as an inverter for converting DC power to AC power. Alternatively, power inverter 130 may convert an AC power source to a three phase AC power source for driving motor 110. Power source 170 may be any suitable power source for driving motor 110 with power inverter 130. Power source 170 may be a DC power supply, a fuel cell, or other types of power sources.

In the exemplary embodiment shown in FIG. 1, power source 170 is a DC power source and power inverter 130 includes input side 131 with a positive power inverter terminal 133 and a negative power inverter terminal 135. Exemplary power inverter 130 also includes an output side 132 with AC phase terminals for supplying AC current to the three phases of exemplary motor 110 such as a first phase terminal 134, a second phase terminal 136 and a third phase terminal 138. Power inverter 130 may use pulse width modulation such as discontinuous pulse width modulation, space vector pulse width modulation, or sine pulse width modulation or any other techniques for controlling and driving motor 110. Current sensors (not shown) may be connected between any two of the phase terminals and any two of the phase windings to measure current for feedback control of motor 110.

Processor 140 is any device capable of receiving input signals and of producing signals for controlling power inverter 130. In the exemplary embodiment, processor 140 is coupled to power inverter 130 for controlling power inverter 130 and motor 110. The current sensors may be coupled to processor 140 to provide feedback for controlling power inverter 130 and motor 110. Other signals may be used for controlling power inverter 130, as well as for other functions. Although a single processor is shown in FIG. 1, the functions of processor 140 as described herein may be performed by any number of processors using any type of software and/or firmware modules. The processor functions may alternatively be implemented in hardware, or any combination of hardware, software and/or firmware. Processor 140 may receive one or more signals from the input side 131 of power inverter 130 and may determine if loss of isolation has occurred. As described more fully below, processor 140 directs power inverter 130 to control motor 110 in accordance with the determination of whether there is loss of isolation in phase windings 114-118 of motor 110.

In an exemplary embodiment, processor 140 is coupled to a display 142 or other feedback display device as appropriate. Display 142 is any device capable of displaying an output from processor 140. In one embodiment motor system 100 is a motor system in an electric vehicle, such as a hybrid electric vehicle. Display 142 may be a part of a visual display for a driver such as a driver information console, an LED on a dashboard and/or other display devices in a vehicle. Display 142 may be used to alert a driver of a vehicle of the status of motor system 100, including whether processor 140 has determined that motor 110 has a short to chassis as well as other faults related to motor system 100.

Power bus 150 is any device or system that couples power inverter 130 to power source 170, and enables current to flow between components. In various embodiments, power bus 150 may include an electromagnetic compatibility (EMC) circuit with a first capacitor 152 coupled between a negative terminal 174 of power source 170 and motor chassis 112 (ground), and a second capacitor 162 coupled between a positive terminal 172 of power source 170 and motor chassis 112 (ground). Bulk capacitors 173 may also be coupled between positive terminal 172 and negative terminal 174 and used to filter imperfections in DC voltage from power source 170.

In the exemplary embodiment shown in FIG. 1, when a phase to ground fault occurs, first voltage 151 includes AC voltage from output side 132 of power inverter 130 that is used to drive the shorted phase, such as third phase winding 118 in this example. The AC voltage used to drive the shorted phase may be transmitted through motor chassis 112 and ground connection 190 as short circuit current signal 122. Short circuit current signal 122 may cause first voltage 151 to be present across first capacitor 152, and a second voltage 161 to be present across second capacitor 162. First voltage 151 and/or second voltage 161 may be measured to determine when a fault has occurred in motor system 100, including a phase to ground loss of isolation in motor 110 and/or DC loss of isolation in power bus 150.

In the exemplary embodiment when a phase to ground fault occurs, the first voltage 151 and second voltage 161 will contain an AC signal that is related to the AC voltage used to drive the shorted phase. A fault may be detected by identifying the presence of AC voltage from the output side 132 of power inverter across first capacitor 152 and/or second capacitor 162. In the exemplary embodiment the AC voltage will only be present when there is a phase to ground fault, since the AC voltage is isolated from first capacitor 152 and second capacitor 162 during normal operation.

First voltage 151 and/or second voltage 161 may be measured in any manner. The EMC circuit, for example, may also include a first measurement resistor 153 and a first voltage divider resistor 154 to measure first voltage 151. In the exemplary embodiment first voltage divider resistor 154 and first measurement resistor 153 function as a voltage divider circuit with a first voltage signal 155 measured across measurement resistor 153. First voltage signal is suitably proportional to first voltage 151, so that first voltage signal 155 is at a suitable voltage level for measurement by processor 140. In the exemplary embodiment the EMC circuit also includes a second measurement resistor 163 and a second voltage divider resistor 164. A second voltage signal 165 that is proportional to second voltage 161 may be measured across second measurement resistor 163. As with first measurement resistor 153, second measurement resistor 163 may be selected to provide second voltage signal 165 at a suitable voltage level for processor 140. In an exemplary embodiment first voltage divider resistor 154 and second voltage divider resistor 164 have substantially equal resistance values to provide substantially equal voltage divider circuits for measuring first voltage 151 and second voltage 161. In other embodiments first voltage divider resistor 154 and second voltage divider resistor 164 may have different values. Other circuits and other methods of measuring first voltage 151 and/or second voltage 161 may be used.

In various embodiments discussed below first voltage signal 155 and/or second voltage signal 165 can be filtered, processed, measured or otherwise applied to determine loss of isolation in motor 110. For the purpose of simplicity, the discussion below regarding determining loss of AC isolation in motor 110 will primarily focus on first voltage signal, although second voltage signal may also be used for this purpose. In an exemplary embodiment, as discussed below, both first voltage signal 155 and second voltage signal 165 are utilized and compared to determine loss of isolation in power bus 150, and/or loss of isolation in motor 110 when motor 110 is operating at a low speed or stall condition.

When a phase to ground fault occurs in the exemplary embodiment, first voltage signal 155 includes AC signals related to the AC voltage used to drive the shorted phase. The AC signals may be at a frequency related to the present operating speed of motor 110 as a fundamental frequency. The AC signals from the shorted phase therefore produce components of first voltage signal 155 as fundamental frequency components. In the exemplary embodiment the fundamental frequency components are used to determine when an AC loss of isolation occurs in any of the three phase windings 114, 116 and/or 118.

Fundamental frequency components may include voltage signals at the fundamental frequency. In the exemplary embodiment the fundamental frequency used to drive the phases of motor 110 is within a range measured in cycles per second, and is related to the present operating speed of motor 110 measured in rotations per second. The correlation between cycles per second of fundamental frequency and rotations per second of the present motor speed may depend on the motor control technique, and/or the configuration of a specific motor, and such correlation is understood by those knowledgeable in the art of motor controls.

First voltage signal 155 may also contain other components, including DC components, and/or switching components. The DC components may include voltages related to the state of power bus 150. As described below, the DC components may be used to determine faults in the power bus, such as DC loss of isolation. The switching components may be related to a switching technique used to drive motor 110.

In the exemplary embodiment first voltage signal 155 is filtered to extract the fundamental frequency component. The fundamental frequency component may be processed by processor 140 to measure amplitude of the fundamental frequency component. In the exemplary embodiment when the fundamental frequency component has a relatively large amplitude, processor 140 determines that there is a phase to ground fault in motor 110. Conversely, when the fundamental frequency component has a relatively small amplitude processor 140 may determine that motor system 110 is operating under normal conditions with the motor phase windings 114, 116, and 118 isolated from motor chassis 112. As discussed below a partial short may also be detected by motor system 100.

Motor system 100 filters first voltage signal 155 and second voltage signal 165 in any suitable manner to determine when fault conditions occur. First voltage signal 155, for example, may be filtered using a first low pass filter 182 and a second low pass filter 184. In the exemplary embodiment first low pass filter 182 and second low pass filter 184 are configured to filter out the switching components from first voltage signal 155 and second voltage signal 165. First low pass filter 182 and second low pass filter 184 may be implemented in any manner such as in hardware, in a processor using software and/or firmware, as well as other methods. In the exemplary embodiment, first low pass filter 182 and second low pass filter 184 are implemented as discrete circuits that have a cut-off frequency lower than the switching frequency or frequencies used to control motor 110. Processor 140, for example, may control power inverter 130 with a switching frequency in a range of about 10 kHz to about 50 kHz, and a fundamental frequency in a range of about zero hertz to about 3 kHz for operating motor 110 in a vehicle application. In other embodiments and/or other applications, processor 140 may direct power inverter 130 to operate motor 110 using other frequency ranges. In the exemplary embodiment, first low pass filter 182 and second low pass filter 184 may have a cut-off frequency of about 2 kHz to attenuate the switching components of first voltage signal 155 and second voltage signal 165 without significantly attenuating the fundamental frequency components.

First voltage signal 155 may be further filtered and/or processed in any suitable manner for determining loss of isolation fault in motor system 100. In the exemplary embodiment processor 140 converts first voltage signal 155 to a digital format using an analog to digital (A/D) inverter. The A/D inverter may be part of processor 140 and sample first voltage signal 155 at a rate that is at least twice the rate of the highest fundamental frequency for motor 110. For example, processor 140 may sample first voltage signal 155 at a rate of about 4 kHz or higher. In other embodiments other sampling rates may be used to convert first voltage signal 155 including the fundamental frequency components and DC components to a digital format. In the exemplary embodiment the fundamental frequency components are used to determine loss of isolation in motor 110 and the DC components are used to determine loss of isolation in power bus 150 as discussed below.

In FIG. 1 motor system 100 is an exemplary three phase motor system 100. Other multi-phase motor systems with more or fewer phases may be employed in other embodiments. For the purpose of simplicity discussion is focused primarily on a three phase motor system; the principles discussed, however, may be applied to other multi-phase motor systems, or single phase systems, as well as other motor control systems. Variations may also exist in the function and structure of motor system 100 in other ways. Other configurations of power supplies, electromagnetic compatibility circuits, processors, and other components may be used in other embodiments.

Processor 140 in the exemplary embodiment utilizes one or more processes to determine AC and/or DC loss of isolation in motor system 100. Processor 140, for example, may execute a process for determining AC loss of isolation, and may also simultaneously or subsequently execute a process for determining DC loss of isolation. Processor 140 may also execute one or more processes that each determine if loss of isolation has occurred. Multiple processes, for example, may each be used to determine AC loss of isolation, with the final determinations compared to verify results. FIGS. 2, 6, 10 and 11 show exemplary processes that may be performed by motor system 100 including processor 140. The exemplary processes shown in FIGS. 2, 6, 10 and 11 may be performed as alternative processes, or as complementary processes. Generally speaking, the various functions and features of the methods shown in FIGS. 2, 6, 10 and 11 may be carried out with any sort of hardware, software, and/or firmware logic that is stored and or executed on any platform. Some or all of the methods shown may be carried out, for example, by logic executing within motor system 100 in FIG. 1. In one embodiment, processor 140 executes software logic that performs each of the various functions shown in FIGS. 2, 6, 10 and 11.

Figure 2:
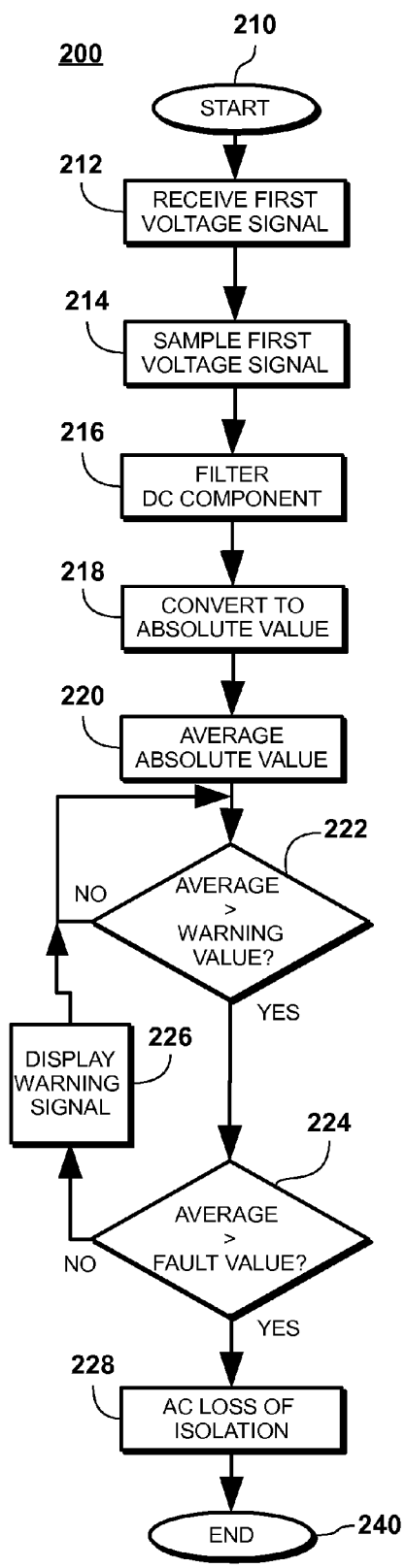
FIG. 2 shows a flow diagram of an exemplary method of detecting loss of isolation in a motor system using an average voltage value of a fundamental frequency component amplitude.

Turning now to FIG. 2, an exemplary method 200 for determining AC loss of isolation in a motor system suitably includes the broad functions of receiving first voltage signal 155 (function 212), filtering first voltage signal 155 to attenuate DC components (function 216) and determining that AC loss of isolation exists (function 228). Other embodiments may additionally sample first voltage signal 155 (function 214), convert the filtered first voltage signal to an absolute value (function 218) and/or may average the absolute value (function 220). Various other functions and other features may also be provided as described in increasing detail below.

In the exemplary embodiment, method 200 begins at function 210. Processor 140 (FIG. 1) may receive first voltage signal 155 in any manner (function 212). First voltage signal 155, for example, may be received by a data acquisition module that is part of processor 140. In the exemplary embodiment the data acquisition unit samples first voltage signal 155 (function 214). In one embodiment of method 200, first voltage signal 155 is converted into a digital first voltage signal, and the remaining functions are performed using digital signal processing techniques.

In the exemplary embodiment first voltage signal 155 (FIG. 1) is received by processor 140 and has a fundamental frequency component, and a DC component, with switching components removed by first low pass filter 182. As discussed above, the fundamental frequency component may be related to loss of isolation in motor 110.

As discussed above, the fundamental frequency is a frequency within a range that is related to the speed of motor 110. Motor 110 may be controlled to have a maximum speed that corresponds to a highest value for the fundamental frequency range. In one embodiment the function of sampling (function 214) is performed at a rate that is equal to or greater than twice the highest value of the fundamental frequency range, although other embodiments may use other values. In other embodiments processor 140, samples at rates that are lower than the highest value of the fundamental frequency range, such as twice the present operating fundamental frequency or any other suitable sampling rate.

Exemplary method 200 filters out DC components from first voltage signal 155 (function 216). In an exemplary embodiment, for example, processor 140 utilizes digital signal processing techniques to attenuate or remove DC components from first voltage signal 155. Processor 140 may use a process that acts as a high pass filter with a relatively low cut-off frequency, such as 10 Hz. In the exemplary embodiment, after filtering out the DC component (function 216) first voltage signal 155 primarily includes fundamental frequency components. As discussed above, the fundamental frequency component may include a signal at the fundamental frequency from the shorted phase winding (e.g. third phase winding 188 from FIG. 1), and may also include fundamental frequency components from other phase windings. In an exemplary motor system 100 with a three phase motor 110, the fundamental frequency component of first voltage signal 155 includes a signal at three times the fundamental frequency from the combination of all three phases and also includes a signal from the shorted phase winding at the fundamental frequency. During normal operation, without a phase to ground short, the fundamental frequency component is relatively small. When a phase to ground short occurs, the fundamental frequency component may be relatively large in comparison. The presence and/or magnitude of this fundamental frequency component can be directly correlated to the presence of a phase to ground fault in motor 110 or similar fault.

The fundamental frequency component may be measured in any manner to determine if an AC loss of isolation has occurred. In exemplary method 200, first voltage signal 155 (FIG. 1) with the fundamental frequency component is converted to an absolute value (function 218). Converting the fundamental frequency component to an absolute value may allow the amplitude of the fundamental frequency to be measured. The absolute value signal is averaged over a period of time (function 220) to provide a measurement of the amplitude of the fundamental frequency component from first voltage signal 155. The time period for averaging may be related to the lowest fundamental frequency that can be measured with the sampling rate. In one embodiment a sampling time period of 0.25 seconds is used to sample a range of fundamental frequencies including relatively low frequencies.

In exemplary method 200 the average voltage value is compared with one or more values to determine if AC loss of isolation has occurred. The average voltage value of the fundamental frequency component amplitude may be compared with a warning value (function 222), for example, to determine if a warning should be issued to a vehicle operator. If the average voltage value is lower than the warning value, processor 140 determines that motor 110 is operating under normal operating conditions, and continues to operate motor and monitor the average voltage value of the fundamental frequency component amplitude of first voltage signal 155 (FIG. 1). When the average voltage value is larger than the warning value, however, processor 140 may determine if the average voltage value exceeds a fault value (function 224), that is larger than the warning value.

If the average voltage value of the fundamental frequency component amplitude from first voltage signal 155 (FIG. 1) is lower than a fault value, processor 140 may determine that there is a partial phase to ground short but that the motor can continue operating for a short time, and/or at a limited capacity without causing damage to motor system 100 or other systems. Processor may provide output signals such as signals to display a warning (function 226) to an operator of motor system 100. Processor may then continue to receive first voltage signal 155 to determine if the short to chassis condition changes.

In the exemplary embodiment if the average voltage value of the fundamental frequency component amplitude from first voltage signal 155 (FIG. 1) is equal to or larger than the fault value, then processor 140 determines that AC loss of isolation has occurred (function 228) and may perform functions based on the determination such as directing power inverter 130 to stop supplying AC current to motor 10. Processor may also send information to display 142 related to the condition of motor 110. A vehicle with multiple motors, for example, may experience a phase to ground short in one motor, and a driver information center may display information showing that one of the motors has shut down due to a failure. Exemplary method 200 ends at function 240.

Figure 3:
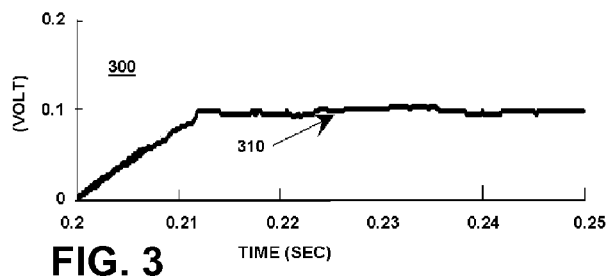
FIGS. 3-5 show graphs with exemplary average voltage values of the fundamental frequency component amplitude measured over time for specific embodiments according to the method shown in FIG. 2 or other suitable methods.
Figure 4:
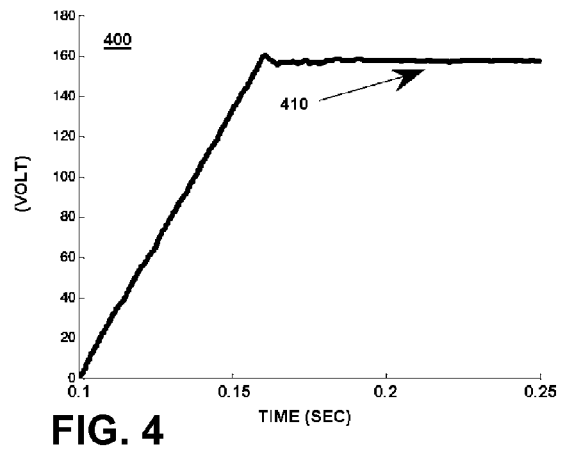
Figure 5:
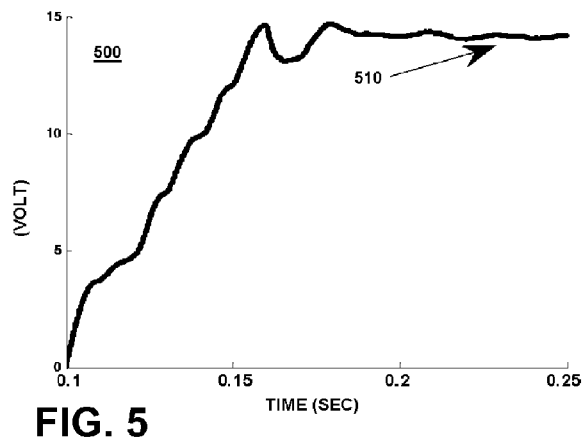

FIGS. 3-5 show graphs with exemplary average voltage values of the amplitude for the fundamental frequency component measured over time for specific embodiments according to method 200 or other suitable methods. As discussed above, first voltage signal 155 (FIG. 1) and/or second voltage signal 165 is filtered to obtain the fundamental frequency component. According to method 200 the fundamental frequency component is measured by averaging the voltage amplitude of first voltage signal 155 after filtering to remove other components.

FIG. 3 shows a graph 300 of an average voltage value 310 of the fundamental frequency component amplitude according to function 220 of method 200 (FIG. 2). In this example, the phase windings are properly isolated from ground for the exemplary embodiment of graph 300. Graph 300 shows average voltage value 310 of the fundamental frequency component amplitude as being relatively low, for example around 0.1 volts at a healthy system condition. The average voltage value of the fundamental frequency component amplitude according to method 200 represents the amplitude of the AC signal transmitted from output side 132 of power inverter 130 through ground connection 190. Under normal operating conditions there may be a small signal detected due to imperfections in motor system 100. The relatively small average voltage value 310 may also be due to electrical noise or other non-ideal conditions in measuring first voltage signal 155. In the exemplary embodiment when the motor phases are isolated, average voltage value 310 is below the warning value and the fault value as utilized in functions 222 and 224 of method 200.

Graph 400 shows an average voltage value 410 of the fundamental frequency component amplitude when one of the phase windings are shorted to ground. Average voltage value 410 may be determined according to function 220 of method 200 (FIG. 2). For the specific embodiment discussed, average voltage value 410 is above the warning value and the fault value. As shown in graph 400, average voltage value 410 from motor system 100 in a fault state may be about 160 volts after 0.2 seconds of measuring the absolute value according to method 200. In the exemplary embodiment the voltage level of average voltage value 410 is directly related to the amplitude of the fundamental frequency component, and therefore directly related to whether a phase to ground short is present in motor 110. The average voltage level of the fundamental frequency component amplitude in a specific system may depend on many different factors and may vary depending on the supply voltage, the controlling techniques, whether the short to chassis has relatively low impedance or higher impedance, as well as other factors. In the exemplary embodiments, the amplitude of average voltage value 410 is related to a magnitude of short circuit current signal 122, and may be used to determine if a warning value and/or a fault value have been exceeded. As discussed above various controlling techniques may be used to control motor 110 (FIG. 1). FIG. 4 shows a graph 400 from an embodiment utilizing a discontinuous pulse width modulation (DPWM) controlling technique.

FIG. 5 shows a graph 500 from an embodiment utilizing a sine pulse width modulation (SPWM) controlling technique with a phase to ground fault condition. The graph shows an average voltage value 510 of the fundamental frequency amplitude according to function 220 of method 200 (FIG. 2). One of the phase windings are shorted to ground in the exemplary embodiment of graph 500. As discussed above, various factors may affect an average voltage level of the fundamental frequency component amplitude measured by processor 140 (FIG. 1) utilizing method 200, or other suitable methods. As shown on graph 500, average voltage value 510 may have a voltage of about 14 volts after 0.2 seconds of averaging. Processor 140 may compare the voltage level of average voltage value 510 with predetermined values to determine if AC loss of isolation has occurred.

Motor system 100 (FIG. 1), utilizing method 200 (FIG. 2) may determine when a loss of AC isolation occurs based on differences in average voltage values (function 220) between a normal operating state and a fault state. FIGS. 3-5, for example, show average voltage values (310, 410, and 510) of the fundamental frequency component amplitude for the embodiments and conditions discussed, with a relatively low average voltage value 310 (less than 0.2 volts) for normal operating conditions, and relatively large average voltage values 410 and/or 510 (greater than 14 volts) for loss of AC isolation conditions. Based on these differences, the exemplary embodiments can determine when loss of isolation occurs with a high degree of accuracy and reliability.

Figure 6:
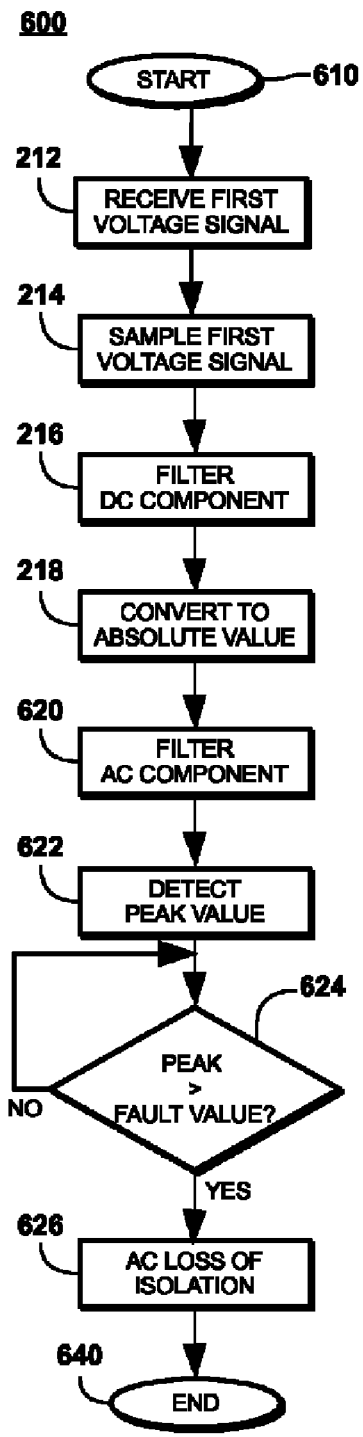
FIG. 6 shows a flow diagram of an exemplary method of detecting loss of isolation in a motor system using a detected peak voltage value of a fundamental frequency component amplitude.

FIG. 6 shows exemplary method 600 of detecting loss of isolation in a motor system 100 (FIG. 1). Method 600 suitably includes the broad functions of receiving a first voltage signal (function 212), converting the first voltage signal to an absolute value signal (function 218), filtering out or attenuating AC components from the absolute value signal (function 620), detecting a peak value of the absolute value signal (function 620) and determining that loss of isolation has occurred in motor system 100 (function 626). Other embodiments may additionally sample the first voltage signal (function 214) and/or filter out or attenuate DC components from the first voltage signal (function 216). Various other functions and other features may also be provided, as described in increasing detail below.

Exemplary method 600 starts at function 610. Functions 212-218 may be performed as discussed above in connection with FIG. 2 and exemplary method 200. As discussed above, the fundamental frequency component may be measured in any manner to determine if an AC loss of isolation has occurred. In exemplary method 200 an average voltage value from the fundamental frequency component is used to determine if motor 110 is in a fault condition. Similarly, method 600 uses a detected peak voltage value from the fundamental frequency component to determine if motor 110 is in a fault state.

In the exemplary embodiment of method 600, the first voltage signal with the fundamental frequency component is converted to an absolute value signal (function 218). As discussed above, converting the fundamental frequency component to an absolute value may allow the amplitude of the fundamental frequency to be measured. In the exemplary method processor 140 filters out or attenuates AC components from the absolute value signal (function 620). After filtering out the AC components, processor 140 may use the signal to detect a peak voltage value (function 622) to provide a measurement of the amplitude of the fundamental frequency component. The peak voltage value may be measured over a suitable time period, such as about 0.25 seconds or so, although other embodiment may use other values. In exemplary method 600 the amplitude of the peak voltage value and/or the slope of the peak voltage value over time is related to whether there is a phase to ground short in motor 110. Processor 140 may compare the peak voltage value and/or the slope of the peak voltage value with one or more values such as a warning value and/or a fault value. In exemplary method 600, the peak voltage value is compared with a fault value (function 624). When the peak voltage value is lower than the fault value, processor 140 suitably continues to operate motor 110. In the exemplary embodiment, processor 140 continues to receive first voltage signal and to perform the functions of exemplary method 600 while operating motor 110. If the peak voltage value is equal to or larger than the fault value, then processor 140 may determine that AC loss of isolation has occurred in motor 110 (function 626). When loss of isolation is determined, processor 140 may stop operation of motor 110 and/or direct other suitable processes. Exemplary method 600 ends at function 640.

Figure 7:
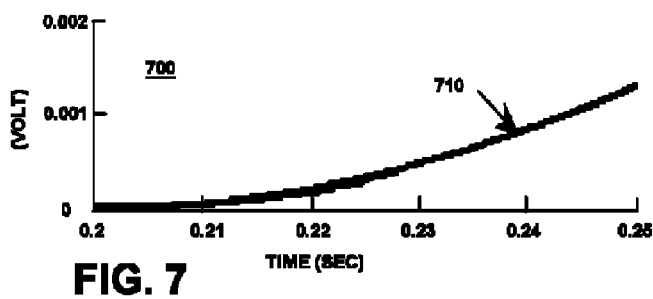
FIGS. 7-9 show graphs with exemplary peak voltage values of the fundamental frequency component amplitude show in relation to time for specific embodiments according to the method shown in FIG. 6 or other suitable methods.
Figure 8:
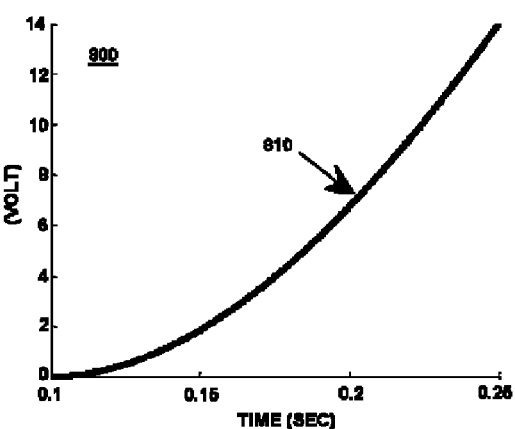
Figure 9:
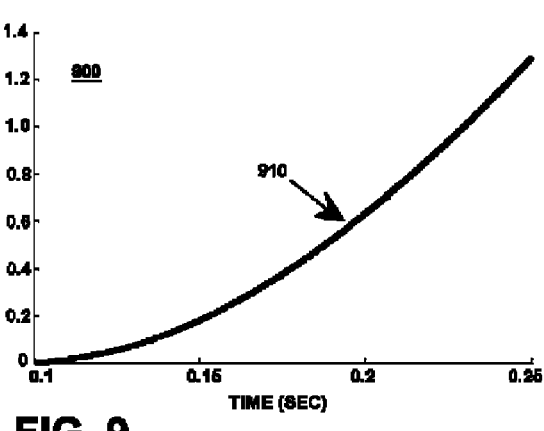

FIGS. 7-9 show graphs with exemplary detected peak voltage values of the fundamental frequency component amplitude, measured over time for specific embodiments according to method 600 or other suitable methods. As discussed above, first voltage signal 155 (FIG. 1) and/or second voltage signal 165 is filtered to obtain the fundamental frequency component. According to method 600 the fundamental frequency component is measured by detecting peak voltage values of the amplitude of first voltage signal 155.

FIG. 7 shows a graph 700 of a peak voltage value 710 of the fundamental frequency component amplitude from first voltage signal 155 (FIG. 1) according to function 622 of method 600 (FIG. 6). The phase windings are properly isolated from ground in the exemplary embodiment shown in graph 700. The peak voltage value 710 of the fundamental frequency component according to method 600 represents the amplitude of the AC signal transmitted from output side 132 of power inverter 130 through ground connection 190. In the exemplary embodiment peak voltage value 710 is relatively small because no current is flowing through ground connection 190 (FIG. 1) at the fundamental frequency. Exemplary graph 700 shows peak voltage value 710 is about zero volts after about 0.2 seconds and less than 0.002 volts at about 0.25 seconds. In the exemplary embodiment peak voltage value 710 of the fundamental frequency component is less than the fault value, and processor 140 determines that phase windings 114, 116 and 118 are properly isolated from ground based on peak voltage value 710.

Graph 800 shows a peak voltage value 810 of the fundamental frequency component amplitude from first voltage signal 155 according to function 622 of method 600 (FIG. 6), when one of the phase windings are shorted to ground. Peak voltage value 810 may be relatively large when motor system 100 (FIG. 1) has a phase to ground fault. In graph 800, for example, peak voltage value 810 is about 6 volts at around 0.2 seconds, and about 14 volts around 0.25 seconds. Peak voltage value 810 may be compared to a fault value to determine if loss of isolation in motor 110 has occurred. In the exemplary embodiment the magnitude of the peak voltage value 810 of the fundamental frequency component amplitude is directly correlated to several factors including the supply voltage, the motor controlling technique, whether the short to chassis has relatively low impedance or higher impedance, as well as other factors. As discussed above various controlling techniques may be used to control motor 110 (FIG. 1). FIG. 8 shows a graph 800 from an embodiment utilizing a discontinuous pulse width modulation (DPWM) controlling technique.

FIG. 9 shows a graph 900 from an embodiment utilizing a sine pulse width modulation (SPWM) controlling technique with a phase to ground fault condition. Graph 900 shows a peak voltage value 910 of the fundamental frequency component amplitude from first voltage signal 155 (FIG. 1) according to function 622 of method 600 (FIG. 6). When a phase to ground fault occurs in motor system 100, peak voltage value 910 may have a relatively large value. Graph 900, for example, shows a relatively large peak voltage value 910 with a value of about 0.6 volts at about 0.2 seconds, and a value of about 1.4 volts at about 0.25 seconds. The peak voltage value 910 of the fundamental frequency component amplitude from a fault state is relatively large compared with peak voltage value 710 (FIG. 7) from a system that does not have a fault state. In the exemplary embodiment when a phase to ground fault occurs, peak voltage value 910 is larger than the fault value as discussed above. Processor 140 may compare peak voltage value 910 to the fault value to determine if AC loss of isolation has occurred, and if control of power inverter 130 should be modified.

Motor system 100 (FIG. 1), utilizing method 600 (FIG. 6) may determine when a loss of AC isolation occurs based on differences in a peak voltage values from the fundamental frequency component amplitude of first voltage signal (function 622) between a normal operating state and a fault state. FIGS. 7-9, for example, show peak voltage values (710, 810, and 910) for the embodiments and conditions discussed, with a relatively low peak voltage value 710 (less than 0.002 volts at 0.25 seconds) for normal operating conditions, and relatively large peak voltage values 810 and/or 910 (greater than 1.2 volts at 0.25 seconds) for loss of AC isolation conditions. The relatively low peak voltage value 710 is a measurement of a low amplitude of the fundamental frequency component amplitude in first voltage signal 155 (FIG. 1), and the relatively high voltage values 810 and/or 910 are a measurement of a relatively large fundamental frequency component in first voltage signal 155. Based on these differences, the exemplary embodiment can determine when loss of isolation occurs with a high degree of accuracy and reliability.

Figure 10:
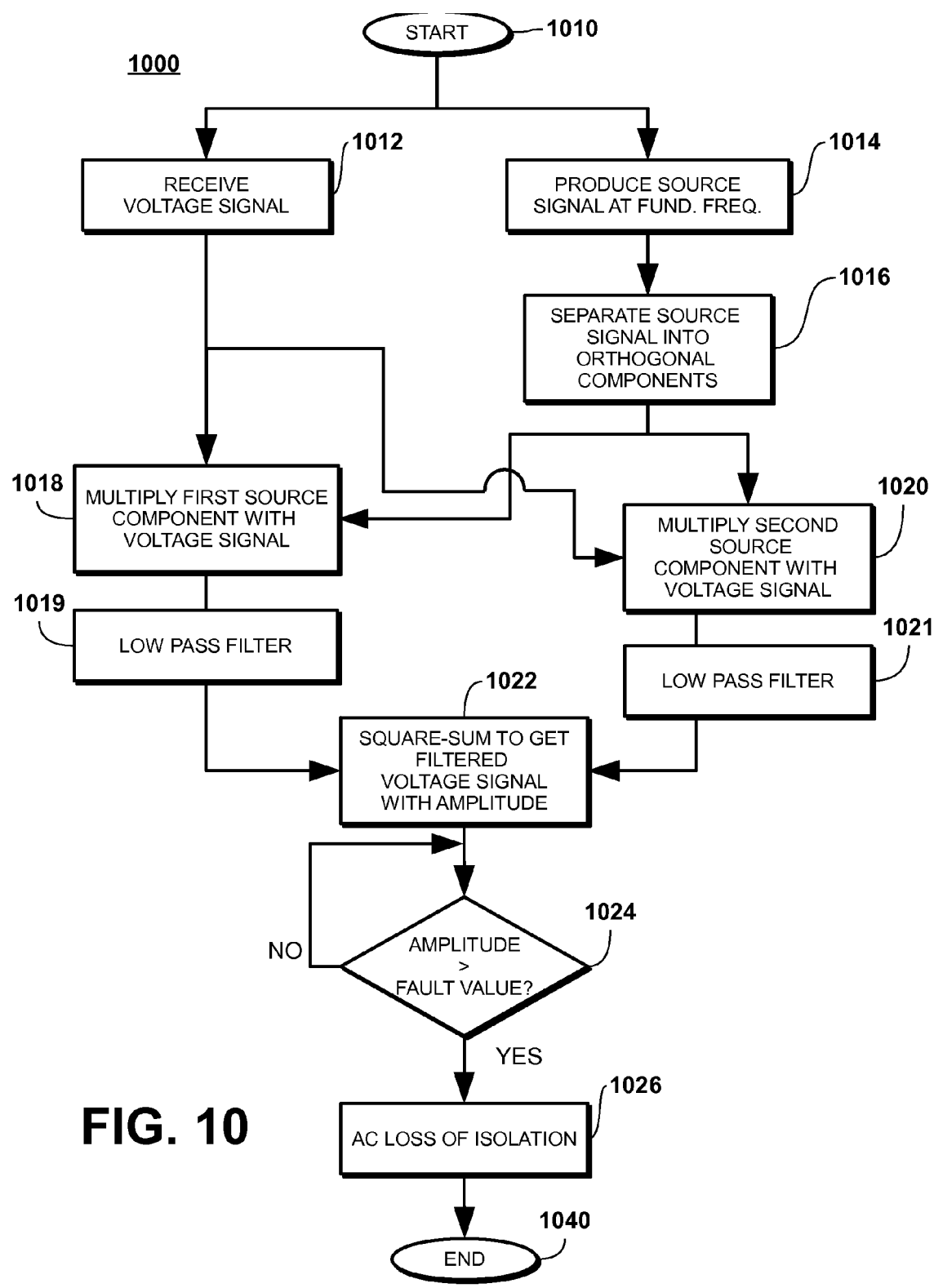
FIG. 10 shows a flow diagram of an exemplary method of detecting loss of isolation in a motor system using orthogonal components of a source signal.

FIG. 10 shows an exemplary method 1000 of detecting loss of isolation in a motor system using orthogonal (e.g. sine and cosine) components of a source signal. Exemplary method 1000 suitably includes the broad functions of receiving a first voltage signal (function 1012), multiplying the first voltage signal with a first orthogonal (sine) component of a source signal (function 1018) resulting in a first portion of the first voltage signal, multiplying the first voltage signal with a second orthogonal (cosine) component of the source signal (function 1020) resulting in a second portion of the first voltage signal, combining the first portion and the second portion of the first voltage signal to get a filtered voltage signal with an amplitude (function 1022) and determining that an AC loss of isolation exist in motor 110 (function 1026). Other embodiments may additionally produce a source signal at the fundamental frequency of motor 110 (function 1014), and/or separate the source signal into orthogonal components (function 1016). Various other functions and other features may also be provided, as described in increasing detail below.

Method 1000 begins at function 1010. In an exemplary embodiment processor 140 (FIG. 1) receives first voltage signal 155 (function 1012) in any suitable manner. Processor 140, for example, may include a data acquisition module with suitable electrical connections for receiving first voltage signal 155. Processor 140 may also produce a source signal at a fundamental frequency (function 1014). For example processor 140 may produce a signal at the fundamental frequency for driving motor 110 and/or for other functions. In the exemplary embodiment the source signal is divided into orthogonal components (function 1016), such as a sine component and a cosine component. A first source component (sine) is multiplied with first voltage signal 155 (function 1018) resulting in a first portion of the first voltage signal. The second source component (cosine) is multiplied with first voltage signal 155 (function 1020) resulting in a second portion of the first voltage signal. The first portion and the second portion are filtered using two low pass filters implemented in the software (functions 1019 and 1021). These two outputs of the low-pass filters are square-summed (function 1022) to get an amplitude that can be compared with the threshold fault value (function 1024). This process removes low frequency components such as DC components from the amplitude of the first voltage signal.

In the exemplary embodiment the process of combining first voltage signal 155 with orthogonal components (functions 1018 and 1020) and combining the separate signals (function 1022) removes or attenuates DC components in first voltage signal 155, so that first voltage signal primarily contains fundamental frequency components. In exemplary motor system 100, the fundamental frequency component of first voltage signal 155 has a larger amplitude when there is a phase to ground short in motor 110, compared with the amplitude of the fundamental frequency component under normal conditions. Processor 140 may compare the amplitude of first voltage signal 155 with a fault value (function 1024) to determine if AC loss of isolation has occurred in motor 110. In the exemplary embodiment processor 140 continues to monitor first voltage signal to determine if the amplitude of the fundamental frequency component is larger than the fault value. When the amplitude is equal to or greater than the fault value, then processor may determine that AC loss of isolation has occurred (function 1026), and shut down the operation of motor 110. Other programming logic or functions may be performed by processor 140 and/or other processors when processor 140 determines that AC loss of isolation has occurred.

Figure 11:
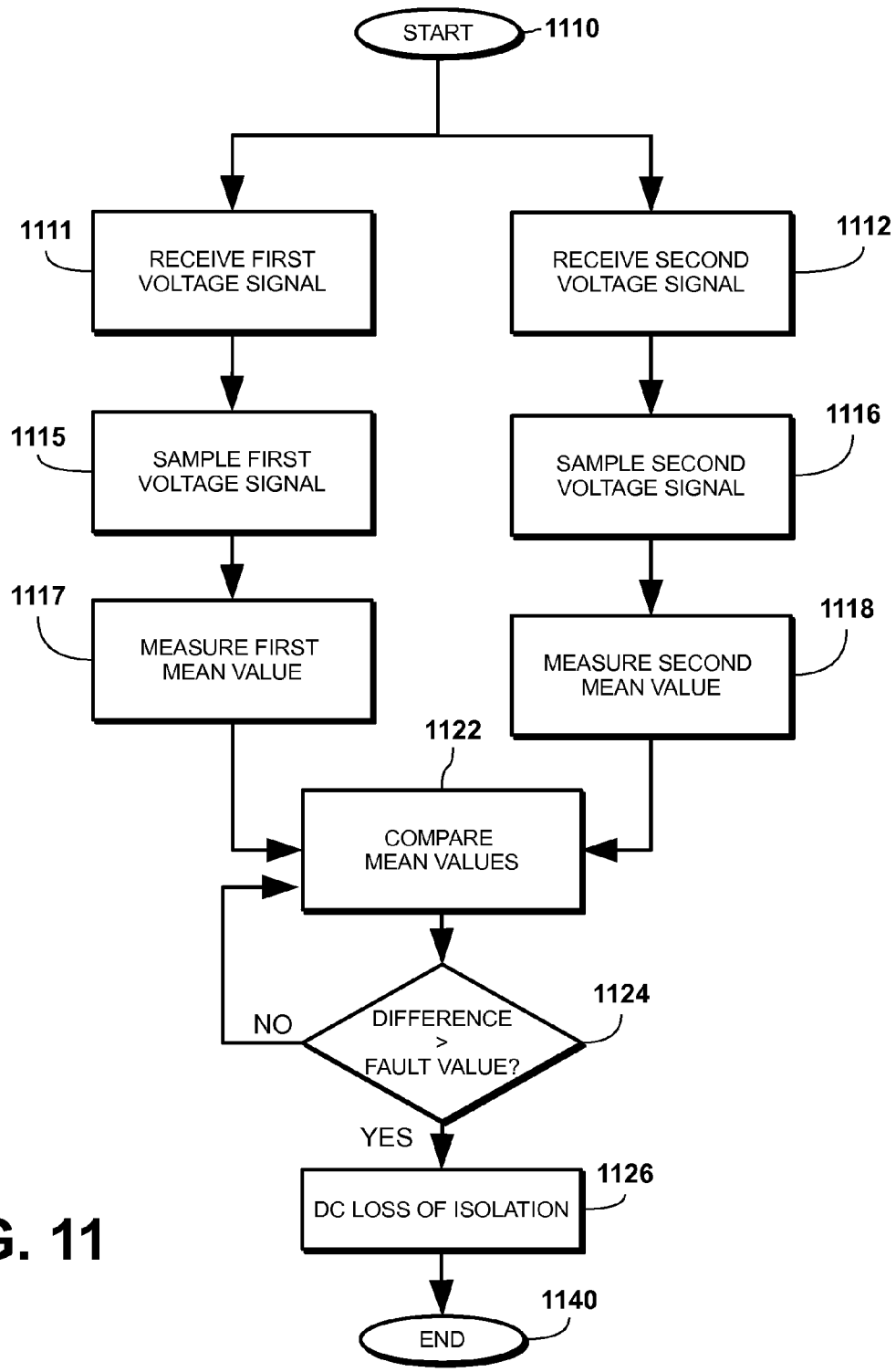
FIG. 11 shows a flow diagram of an exemplary method of detecting loss of isolation in a motor system for loss of DC isolation and/or AC loss of isolation with low motor fundamental frequency output conditions.

FIG. 11 shows a flow diagram of an exemplary method 1100 of detecting loss of isolation in a motor system 100 (FIG. 1). Method 1100 suitably includes the broad functions of receiving a first voltage signal (function 1111) and a second voltage signal (function 1112), measuring a first mean value of the first voltage signal (function 1117) and a second mean value of the second voltage signal (function 1118), comparing the first mean value to the second mean value (function 1122), and determining if loss of isolation has occurred (function 1126). Other embodiments may additionally sample first voltage signal (function 1115) and second voltage signal (function 1116). Various other functions and other features may also be provided, as described in increasing detail below.

Exemplary method 1100 may be used to detect phase to ground loss of isolation when motor 110 (FIG. 1) is operating with a low fundamental frequency and/or at a stall condition. When motor system 100 is used in a vehicle, for example, the speed of the vehicle may be related to the speed and/or fundamental frequency of motor 110. When the vehicle is stopped or moving at a slow speed, the fundamental frequency may be lower than a lowest suitable frequency for use in some methods of detecting AC loss of isolation. Exemplary method 1100 may detect AC loss of isolation at low fundamental frequencies, and may also detect DC loss of isolation. DC loss of isolation may occur, for example, when there is a short or a partial short between positive terminal 172 or negative terminal 174 of power source 170, and ground 190 such as a vehicle chassis or motor chassis 112.

Exemplary method 1100 begins at function 1110. Processor 140 (FIG. 1) may receive first voltage signal 155 (function 1111) and second voltage signal 165 (function 1112) in any manner. In an exemplary embodiment processor 140 samples first voltage signal 155 (function 1115) and second voltage signal 165 (function 1116) using an A/D converter that is part of processor or communicatively coupled to processor 140. Processor 140 may measure a first mean value from first voltage signal 155 (function 1117) and a second mean value from second voltage signal 165 (function 1118). In an exemplary embodiment the mean value of first voltage signal 155 and second voltage signal 165 are related to the amplitude of DC components of voltage signals 155 and 165.

Under normal operating conditions, first mean value is approximately equal to second mean value. Under fault conditions, however, the first mean value may be significantly different from second mean value. If motor system 100 (FIG. 1) experienced a short in power bus 150, for example, a short between negative terminal 174 and motor chassis 112, first voltage signal 155 may have a significantly smaller DC component amplitude than second voltage signal 165. The short in power bus 150 may be detected by comparing mean values of first voltage signal 155 and second voltage signal 165 (function 1122). Alternatively, if a phase to ground short occurs during a stall condition of motor 110, the shorted phase may cause a DC offset in either the first or second voltage signal.

The phase to ground short may be detected by processor 140 comparing mean values (function 1122). Other faults in motor system 100 may cause a difference in mean value between first mean value and second mean value.

In the exemplary method 1100 a mean difference fault value is used that allows for suitable variations between the first mean value and the second mean values due to such factors as imperfections in circuits, electronic noise, variations in power source 170, as well as other suitably anticipated variations. In the exemplary embodiment the mean difference fault value is compared to the measured difference to determine if a fault has occurred (function 1124). If processor 140 determines that the measured difference is lower than the mean difference fault value, then processor 140 may continue to operate motor 110 and compare mean values from first voltage signal 155 and second voltage signal 165. In method 1100 processor 140 determines that loss of isolation exists if the measured difference is larger than the mean difference fault value (function 1126). Various functions may be performed based on the determination that a DC loss of isolation exists. Processor 140, for example, may communicate to a separate system to disconnect or isolate power supply 170 from power bus 150 when DC loss of isolation is determined. Exemplary method 1100 ends at function 1140.

The exemplary embodiments and methods discussed provide advantages such as reducing the number of current sensors utilized in a multi-phase motor system. Advantages may also include a faster response time to loss of isolation conditions, thereby allowing shut-down of motor system 100 to limit further damage due to a short circuit condition. Various embodiments may also provide the advantage of detecting AC isolation conditions at the same time as the detection of DC isolation conditions. Other advantages may also be realized and understood by persons skilled in the art.

As used herein, the word "exemplary" means "serving as an example, instance, or illustration", rather than as a "model" that would be exactly duplicated. Any implementation described herein as exemplary is not necessarily to be construed as preferred or advantageous over other implementations. Furthermore, there is no intention to be bound by any expressed or implied theory presented in the preceding technical field, background, brief summary or detailed description.

As used herein, the term "substantially" is intended to encompass any slight variations due to design or manufacturing imperfections, device or component tolerances, environmental effects and/or other factors as appropriate. The term "substantially" also allows for variation from a perfect or ideal case due to parasitic effects, noise, and other practical considerations that may be present in an actual implementation.

The foregoing description may refer to elements or nodes or features being "connected" or "coupled" together. As used herein, unless expressly stated otherwise, "connected" means that one element/node/feature is electrically, mechanically, logically or otherwise directly joined to (or directly communicates with) another element/node/feature. Likewise, unless expressly stated otherwise, "coupled" means that one element/node/feature may be mechanically, electrically, logically or otherwise joined to another element/node/feature in either a direct or indirect manner to permit interaction even though the two features may not be directly connected. That is, "coupled" is intended to encompass both direct and indirect joining of elements or other features, including connection with one or more intervening elements.

In addition, certain terminology may also be used in the description for the purpose of reference only, and thus are not intended to be limiting. For example, the terms "first", "second" and other such numerical terms referring to structures or elements do not imply a sequence or order unless clearly indicated by the context.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of detecting loss of isolation in a motor system including an inverter having an input side and an output side, and a motor operating at a fundamental frequency, the motor having a motor chassis that is electrically connected to a vehicle chassis serving as a common reference to the input and output sides of the inverter, the method comprising:
    detecting a first voltage signal on the input side of the inverter;
    filtering the first voltage signal to extract a component of the first voltage signal related to the fundamental frequency that is transmitted to the input side via the common reference, the component of the first voltage signal having a component amplitude; and
    determining if an AC loss of isolation fault exists by comparing the component amplitude to an AC loss of isolation fault value.

2. The method of claim 1 wherein the motor operates in a range related to a range of the fundamental frequency, the fundamental frequency range having a highest value, wherein the filtering includes applying a low pass filter with a cut-off frequency substantially equal to the highest value of the fundamental frequency range.

3. The method of claim 2 wherein the filtering includes sampling the first voltage signal with a sampling rate that is at least twice the highest value of the cut-off frequency of the low pass filter.

4. The method of claim 1 wherein the motor operates in a range related to a range of the fundamental frequency, the fundamental frequency range having a highest value, wherein the filtering includes:
    using a low pass filter circuit with a cutoff frequency substantially equal to the highest value of the fundamental frequency range;
    sampling the first voltage signal with a sampling rate that is at least twice the highest value of the cut-off frequency of the low pass filter; and
    removing DC components of the first voltage signal to obtain the component of the first voltage signal.

5. A method of detecting loss of isolation in a motor system including an inverter having an input side and an output side, and a motor operating at a fundamental frequency, the motor having a motor chassis that is electrically connected to a vehicle chassis serving as a common reference to the input and output sides of the inverter, the method comprising:
    detecting a first voltage signal on the input side of the inverter;
    filtering the first voltage signal to extract a component of the first voltage signal related to the fundamental frequency that is transmitted to the input side via the common reference, the component of the first voltage signal having a component amplitude;

determining if an AC loss of isolation fault exists by comparing the component amplitude to an AC loss of isolation fault value by:

converting the component of the first voltage signal to an absolute value; and averaging the absolute value over time;

comparing the averaged absolute value to a first threshold value;

issuing a warning signal if the averaged absolute value exceeds the first threshold value;

comparing the averaged absolute value to a second threshold value that is higher than the first threshold value; and indicating loss of isolation if the averaged absolute value exceeds the second threshold value.

6. The method of claim 1 wherein determining if a loss of isolation fault exists includes:

converting the component of the first voltage signal to an absolute value signal;

attenuating a non-DC component of the absolute value signal; and detecting a peak value of the attenuated absolute value signal.

7. A method of detecting loss of isolation in a motor system including an inverter having an input side and an output side, and a motor operating at a fundamental frequency, the motor having a motor chassis that is electrically connected to a vehicle chassis serving as a common reference to the input and output sides of the inverter, the method comprising:

detecting a first voltage signal on the input side of the inverter;

filtering the first voltage signal to extract a component of the first voltage signal related to the fundamental frequency that is transmitted to the input side via the common reference, the component of the first voltage signal having a component amplitude, wherein the filtering includes:

separating a source signal at the fundamental frequency into a first orthogonal component and a second orthogonal component;

multiplying the first orthogonal component with the first voltage signal and then attenuating higher frequency components to produce a first portion of the first voltage signal;

multiplying the second orthogonal component with the first voltage signal and then attenuating higher frequency components to produce a second portion of the first voltage signal; and combining the first portion of the first voltage signal and the second portion of the first voltage signal to obtain the component of the first voltage signal having the component amplitude; and determining if an AC loss of isolation fault exists by comparing the component amplitude to an AC loss of isolation fault value.

8. A method of detecting loss of isolation in a motor system including an inverter having an input side and an output side, a motor operating at a fundamental frequency, the motor having a motor chassis that is electrically connected to a vehicle chassis serving as a common reference to the input and output sides of the inverter, a DC power supply, that is substantially isolated from the motor chassis, electrically coupled to the input side of the inverter, the DC power supply having a positive terminal and a negative terminal, wherein the first voltage signal is proportional to a current flowing through a first capacitor electrically coupled between the negative terminal and the motor chassis, the method comprising:

detecting a first voltage signal on the input side of the inverter;

filtering the first voltage signal to extract a component of the first voltage signal related to the fundamental frequency that is transmitted to the input side via the common reference, the component of the first voltage signal having a component amplitude; and determining if an AC loss of isolation fault exists by comparing the component amplitude to an AC loss of isolation fault value;

receiving a second voltage signal that is proportional to current flowing through a second capacitor electrically coupled between the positive terminal and the motor chassis; and determining if a DC loss of isolation fault exists by comparing a mean value of the first voltage signal to a mean value of the second voltage signal.

9. A method of identifying loss of isolation in an electric motor system including a motor having a motor chassis connected to electrical ground, the motor operating at a fundamental frequency; and a power supply operating at a power supply voltage;

the method comprising:

receiving a first voltage signal related to a voltage between a terminal of the power supply and the motor chassis, the first voltage signal including a first component related to the fundamental frequency and a second component related to the power supply voltage;

filtering the first voltage signal to attenuate the first component related to the power supply voltage;

measuring an amplitude of the second component related to the fundamental frequency; and determining if a phase to ground loss of isolation condition exists by comparing the amplitude of the first component to a fault value.

10. The method of claim 9 wherein the receiving the first voltage signal includes sampling the first voltage signal to obtain a digital signal with the first component and the second component.

11. The method of claim 9 wherein the electric motor system applies a switching technique to control the motor with switching frequencies, wherein the first voltage signal includes a third component related to the switching frequencies, the method further comprising filtering the first voltage signal to attenuate the third component related to the switching frequencies prior to the receiving the first voltage signal.

12. The method of claim 9 wherein the measuring the amplitude of the first component of the first voltage signal includes:

converting the first voltage signal to an absolute value signal; and averaging the absolute value signal over a time period to obtain an amplitude of the first component of the first voltage signal.

13. The method of claim 9 wherein the measuring the amplitude of the first component of the first voltage signal includes:

converting the first voltage signal to an absolute value signal; and filtering the absolute value signal to attenuate non-DC components of the absolute value signal;

wherein the measuring the amplitude of the first component includes detecting a peak value of the filtered absolute value signal.

14. The method of claim 9 wherein the filtering of the first voltage signal includes:
producing a source signal with a frequency substantially equal to the fundamental frequency;
separating the source signal into two orthogonal components;
multiplying the first voltage signal with the two orthogonal components to obtain two portions of the first voltage signal; and
combining the two portions of the first voltage signal to obtain the first component of the first voltage signal.

15. The method of claim 9 wherein the power supply is a DC power supply that is substantially isolated from the electrical ground having a positive terminal and a negative terminal, wherein the first voltage signal is proportional to a current flowing between the negative terminal and the motor chassis, the method further comprising;
receiving a second voltage signal that is proportional to current flowing between the positive terminal and the motor chassis; and
determining if a DC loss of isolation fault exists by comparing a mean value of the first voltage signal to a mean value of the second voltage signal.

16. A system comprising:
a power supply that is substantially isolated from electrical ground having a power supply voltage;
a power inverter electrically coupled to the power supply, the power inverter configured to provide AC current from the power supply in an AC phase at an AC terminal, the AC phase having current at a fundamental frequency;
an electric motor electrically coupled to the AC terminal of the power inverter, the electric motor having a chassis that is substantially electrically isolated from the AC terminal of the power inverter under normal operating conditions;
a processor configured to control the AC current provided by the power inverter, the processor configured to receive a first voltage signal related to current flowing through a motor chassis, the first voltage signal including a first component related to the fundamental frequency of the AC phase, and a second component related to the power supply voltage, the processor further configured to filter the first voltage signal to attenuate the second component, to measure an amplitude of the first component, and to determine if an AC loss of isolation condition exists by comparing the amplitude of the first component to a fault value.

17. The system of claim 16 wherein the processor is further configured to convert the first component of the first voltage signal to an absolute value signal and to average the absolute value signal over a time period to obtain an amplitude of the first component.

18. The system of claim 16 wherein the processor is further configured to convert the first component of the first voltage signal to an absolute value signal, to filter the absolute value signal, to attenuate non-DC components of the absolute value signal, and to detect a peak value of the absolute value signal.

19. A system comprising:
a power supply that is substantially isolated from electrical ground having a power supply voltage;
a power inverter electrically coupled to the power supply, the power inverter configured to provide AC current from the power supply in an AC phase at an AC terminal, the AC phase having current at a fundamental frequency;
an electric motor electrically coupled to the AC terminal of the power inverter, the electric motor having a chassis that is substantially electrically isolated from the AC terminal of the power inverter under normal operating conditions;
a processor configured to control the AC current provided by the power inverter, the processor configured to receive a first voltage signal related to current flowing through a motor chassis, the first voltage signal including a first component related to the fundamental frequency of the AC phase, and a second component related to the power supply voltage, the processor further configured to filter the first voltage signal to attenuate the second component, to measure an amplitude of the first component, and to determine if an AC loss of isolation condition exists by comparing the amplitude of the first component to a fault value, the processor further configured to produce a source signal with a frequency substantially equal to the fundamental frequency, to separate the source signal into two orthogonal components, to multiply the first voltage signal with each of the two orthogonal components resulting in two portions of the first voltage signal, and to combine the two portions of the first voltage signal resulting in the first component of the first voltage signal.

* * * * *